United States Patent
Ali et al.

(10) Patent No.: US 11,522,268 B2
(45) Date of Patent: Dec. 6, 2022

(54) WIRELESS DEVICE WITH SUBSTRATE TO ANTENNA COUPLING

(71) Applicant: TEXAS INSTRUMENTS INCORPORATED, Dallas, TX (US)

(72) Inventors: Hassan Omar Ali, Murphy, TX (US); Benjamin Stassen Cook, Los Gatos, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 49 days.

(21) Appl. No.: 17/116,668

(22) Filed: Dec. 9, 2020

(65) Prior Publication Data
US 2021/0218125 A1    Jul. 15, 2021

(51) Int. Cl.
*H03M 1/38* (2006.01)
*H01Q 1/22* (2006.01)
*H01Q 21/00* (2006.01)
*H01Q 23/00* (2006.01)
*H01Q 1/38* (2006.01)

(52) U.S. Cl.
CPC ............ *H01Q 1/2283* (2013.01); *H01Q 1/38* (2013.01); *H01Q 21/0037* (2013.01); *H01Q 23/00* (2013.01)

(58) Field of Classification Search
CPC .... H01Q 1/2283; H01Q 1/38; H01Q 21/0037; H01Q 23/00
USPC ........................................................ 343/702
See application file for complete search history.

(56) References Cited

U.S. PATENT DOCUMENTS

| | | | |
|---|---|---|---|
| 2012/0187511 A1 | 7/2012 | Maurer et al. | |
| 2013/0199829 A1 | 8/2013 | Gottwald | |
| 2017/0093010 A1 | 3/2017 | Herbsommer et al. | |
| 2018/0109005 A1* | 4/2018 | Milano | H01Q 21/065 |
| 2018/0299488 A1* | 10/2018 | Jordan | H01Q 1/38 |
| 2019/0207287 A1 | 7/2019 | Dogiamis et al. | |
| 2020/0036088 A1* | 1/2020 | Bongard | H01Q 25/001 |
| 2020/0294939 A1* | 9/2020 | Aleksov | H01L 24/16 |

FOREIGN PATENT DOCUMENTS

WO    2018052553 A1    3/2018

OTHER PUBLICATIONS

Search Report for PCT Patent Application No. PCT/US2021/012878, dated Apr. 8, 1 page.

(Continued)

*Primary Examiner* — Peguy Jean Pierre
(74) *Attorney, Agent, or Firm* — Michael A. Davis, Jr.; Frank D. Cimino

(57) ABSTRACT

A device comprises an integrated circuit (IC) die, a substrate, a printed circuit board (PCB), an antenna, and a waveguide stub. The IC die is affixed to the substrate, which comprises a signal launch on a surface of the substrate that is configured to emit or receive a signal. The substrate and the antenna are affixed to the PCB, such that the signal launch and a waveguide opening of the antenna are aligned and comprise a signal channel. The waveguide stub is arranged as a boundary around the signal channel. In some implementations, the waveguide stub has a height of λ/4, where λ represents a wavelength of the signal. In some implementations, the antenna includes the waveguide stub; in others, the substrate includes the waveguide stub.

21 Claims, 15 Drawing Sheets

(56) References Cited

OTHER PUBLICATIONS

Nakajima et al., "Microstrip line to waveguide transition with quarter-wavelength open stubs," IEICE Communications Express, vol. 6 No. 6, pp. 309-313.
Kim et al., "Broadband Left-handed Waveguide with Double L-Shaped Short Stubs and E-plane Posts," Dept. of Electronic and Engineering, Hongik University, 978-1-4244-9561-0/11/$26.00 © 2011 IEEE, pp. 2958-2960.

* cited by examiner

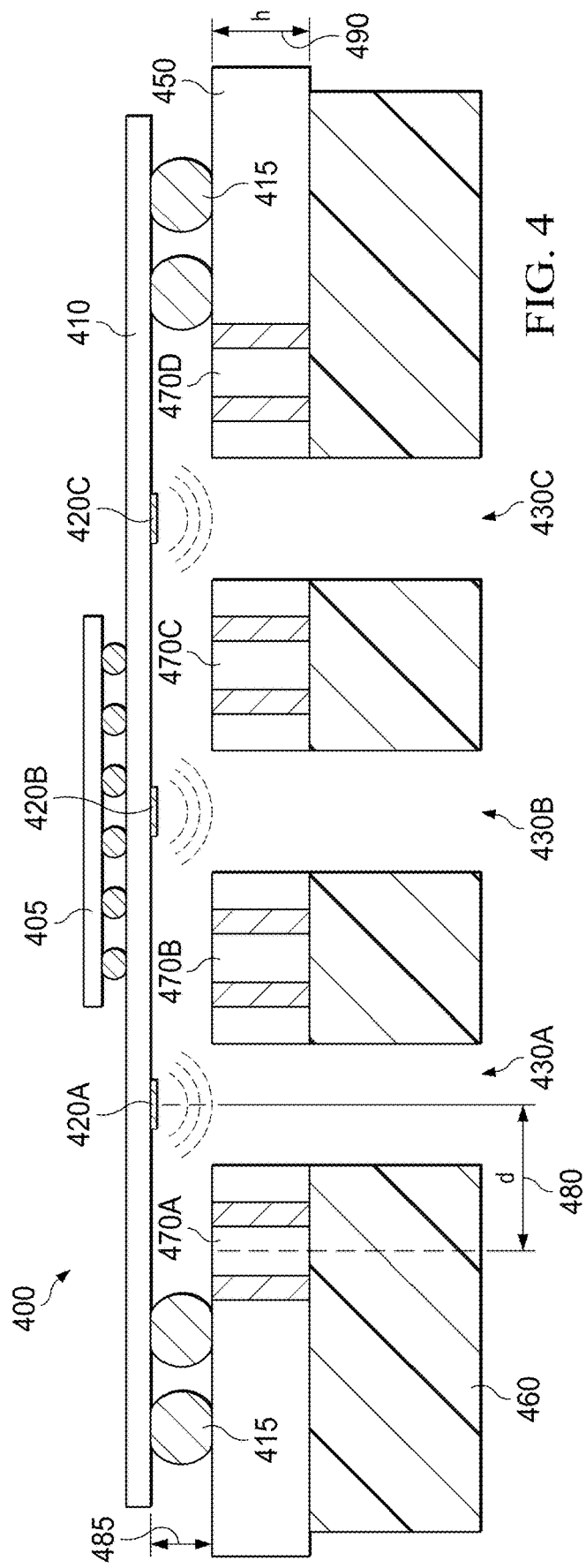

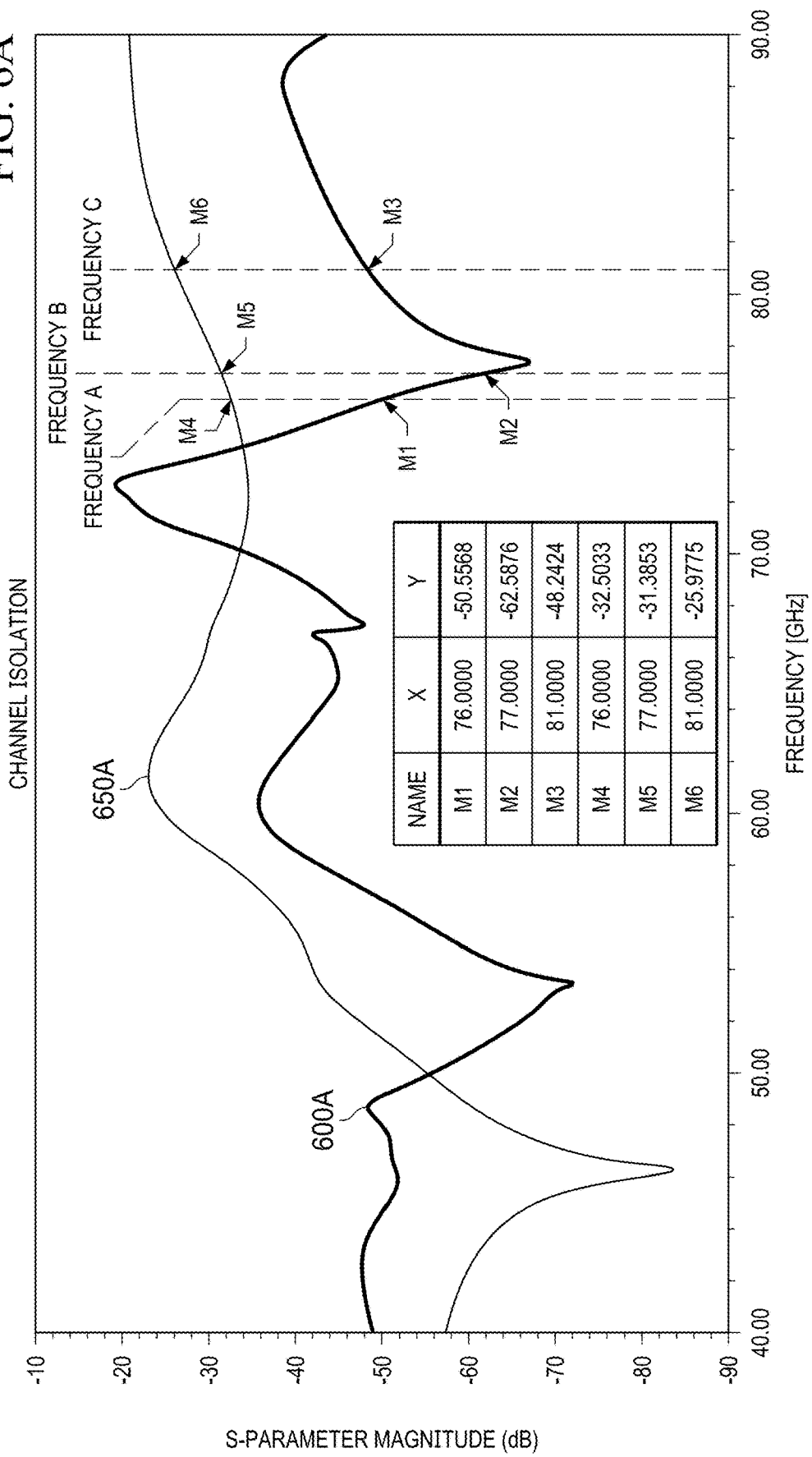

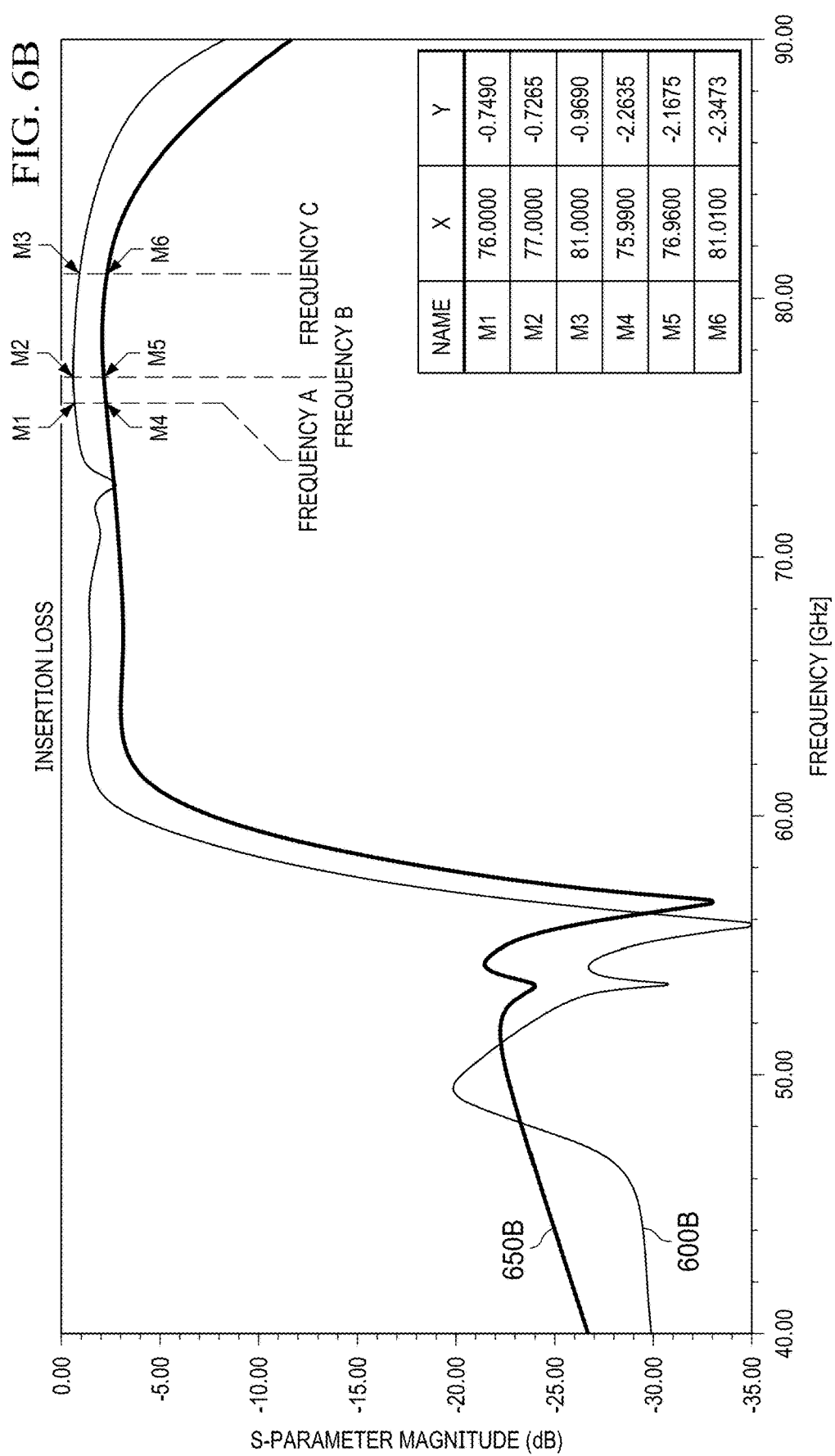

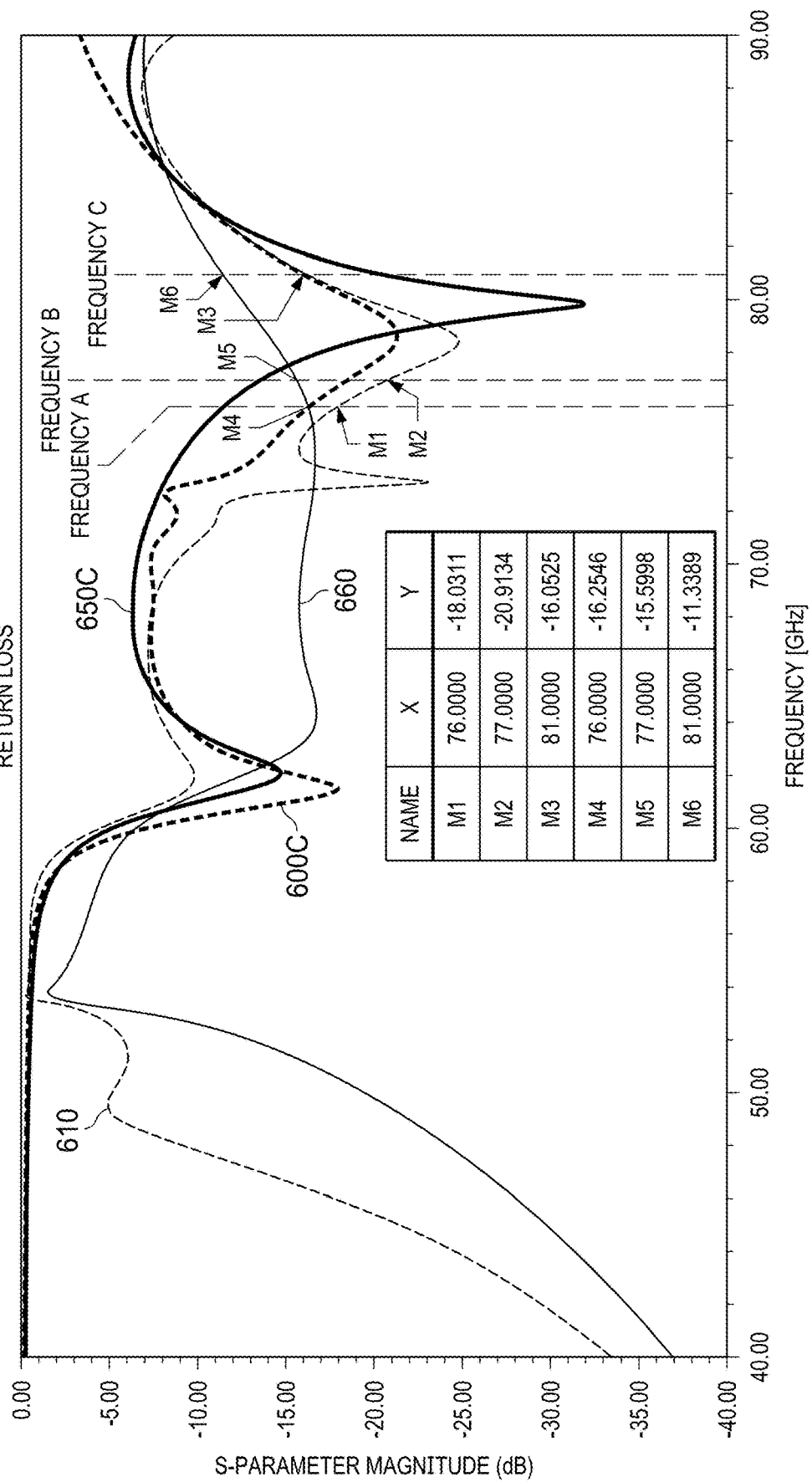

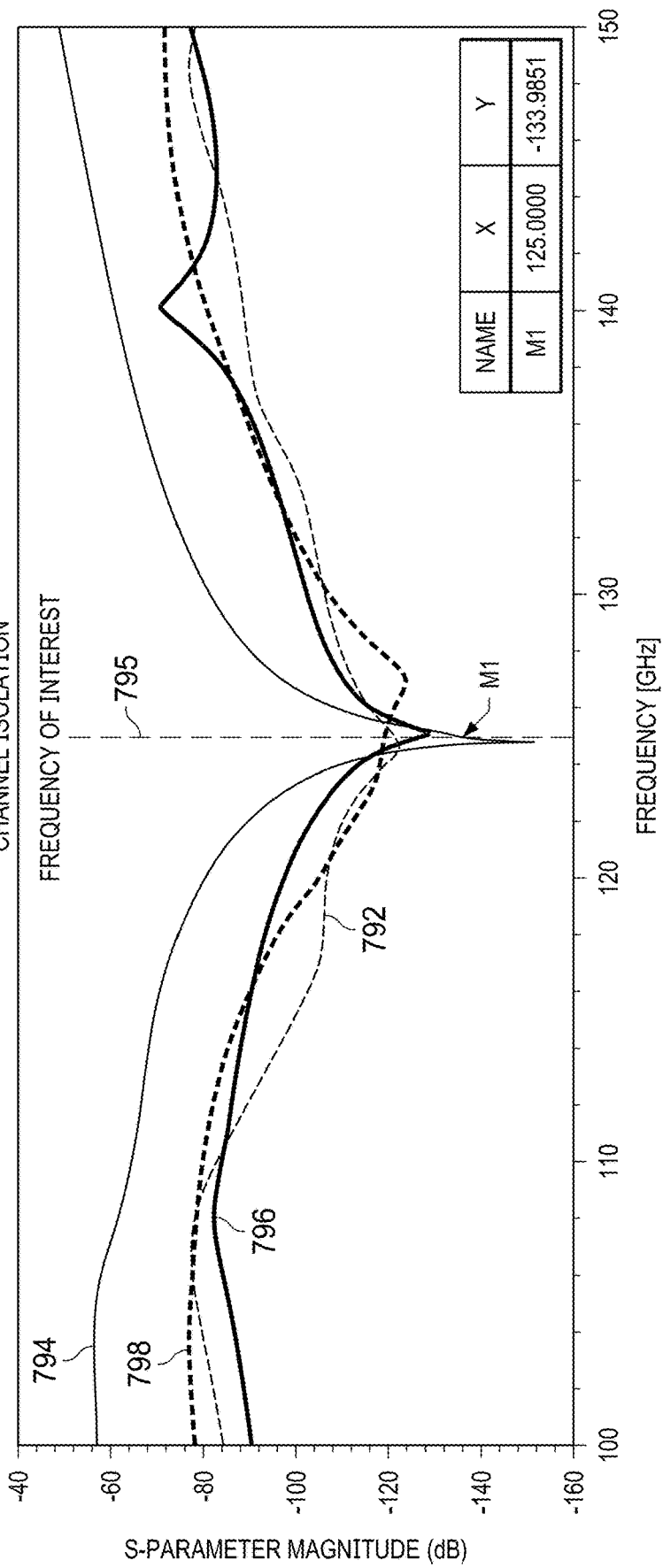

WIRELESS DEVICE WITH SUBSTRATE TO ANTENNA COUPLING

CROSS-REFERENCE TO RELATED APPLICATION

This application claims priority to U.S. Provisional Application No. 62/958,822, filed Jan. 9, 2020, titled "Wireless Device with Efficient and Compact Millimeter-Wave Substrate to Antenna Coupling," which is hereby incorporated herein by reference in its entirety.

BACKGROUND

Many wireless communication systems, such as millimeter wave radar systems, transmit signals from packaged integrated circuits (ICs) to external antennas through waveguides. Some ICs use a direct interface between the packaged device and external waveguides, rather than planar transmission lines. Bottom-side launch-on-package assemblies can be manufactured with fewer steps and greater manufacturing reliability compared to top-side launch-on-package assemblies but can be more difficult to implement at a system level. Alternatively, top-side launch-on-package assemblies can be manufactured without additional steps to add barriers between signal channels, but at the cost of poor channel isolation due to the air gap between the device and a waveguide used to feed a three-dimensional (3D) antenna. Known techniques such as electromagnetic band gap structures improve channel isolation but prevent compact channel placement.

SUMMARY

A device comprises an integrated circuit (IC) die affixed to a substrate, a printed circuit board (PCB), an antenna comprising a waveguide opening, and a waveguide stub. The substrate comprises a signal launch on a surface of the substrate that is configured to emit or receive a signal and is affixed to the PCB. The antenna is affixed to the PCB as well, such that the signal launch and the waveguide opening are aligned and comprise a signal channel. The waveguide stub is arranged as a boundary around the signal channel.

In some implementations, the waveguide stub has a height of $\lambda/4$, wherein $\lambda$ represents a wavelength of the signal. The center of the waveguide stub is a distance less than $\lambda$ from a center of the signal channel in some implementations. The waveguide stub can be incorporated into the antenna or in the substrate, depending on the particular implementation. The waveguide stub can be straight in the substrate in a direction normal to the surface of the substrate, such that the thickness of the substrate is at least as thick as a height of the waveguide stub. Alternatively, the waveguide stub is L-shaped, with a first arm straight in the substrate in a direction normal to the surface of the substrate and a second arm arranged perpendicular to the first arm. The first arm has a first height, and the second arm has a second height; a thickness of the substrate is at least as thick as the first height. A sum of the first and second heights is $\lambda/4$.

In some implementations, the device further includes a second signal channel with a second signal launch on the surface of the substrate and a second waveguide opening in the antenna. A second waveguide stub forms a boundary around the second waveguide channel. In some implementations, the first and second signal channels are arranged close together, such that the first waveguide stub and the second waveguide stub form a waveguide stub structure. A center of the waveguide stub structure is a distance less than $\lambda$ from a center of the first signal channel and the distance less than $\lambda$ from a center of the second signal channel. $\lambda$ represents a wavelength of the first and second signals.

In some implementations, the waveguide stub structure includes dead-space sections occupying space between the first and second signal channels. The dead-space sections are arranged such that a center of the first signal channel is a distance less than $\lambda$ from a center of a first section of the waveguide stub structure between the first signal channel and the dead-space section. The dead space sections are also arranged such that a center of the second signal channel is the distance less than $\lambda$ from a center of a second section of the waveguide stub structure between the second signal channel and the dead-space section.

BRIEF DESCRIPTION OF THE DRAWINGS

FIG. 4 illustrates an example bottom-side launch-on-package assembly with waveguide stubs in a printed circuit board to which the assembly is affixed.

FIGS. 6A-C illustrate graphs of channel isolation, insertion loss, and return loss for the example assembly shown in FIG. 5.

FIGS. 7A-D illustrate cross section and overhead views of an example top-side launch-on-package assembly with circular waveguide stubs in a waveguide of an associated 3D antenna, as well as a simulation plot of a signal through the assembly and a graph of channel isolation for the assembly.

DETAILED DESCRIPTION

The described devices provide an interface to external antennae that is robust to manufacturing and assembly tolerances, relatively easy to implement at a system level, and with improved channel isolation. The described devices include an integrated circuit (IC) die affixed to a substrate having a surface with a signal launch configured to emit or receive a signal. The substrate and an external antenna are affixed to a printed circuit board (PCB). The external antenna includes a waveguide opening. The waveguide opening and the signal launch are aligned and form a signal channel.

A waveguide stub is arranged as a boundary around the signal channel and reflects signal leakage from the signal channel. The reflected signals constructively interfere with the signal leakage, effectively reducing the signal leakage from the signal channel and improving signal isolation. The waveguide stub has a height $\lambda/4$ based on the wavelength $\lambda$ of the signal, and is placed around the signal channel such that the center of the waveguide stub is a distance less than $\lambda$ from the center of the signal channel.

The waveguide stub can be placed in the external antenna, in the substrate, or the PCB. For waveguide stubs implemented in the substrate, the waveguide stub can be placed straight in the substrate, in which case the thickness of the substrate is at least as thick as a height λ/4 of the waveguide stub. Alternatively, the waveguide stub can be L-shaped with a first arm arranged straight in the substrate and a second arm arranged perpendicular to the first arm. The height of the first arm and the height of the second arm add up to the total height λ/4 of the waveguide stub. With L-shaped waveguide stubs, the thickness of the substrate is at least as thick as the height of the first arm arranged straight in the substrate.

For devices with multiple channels, the waveguide stubs surrounding each signal channel can join together into a single cutout around the signal channels. For channel configurations in which a single cutout around the signal channels could cause the distance between the center of a particular signal channel and the center of the waveguide stub surrounding it to be greater than λ, dead-space sections can be strategically placed within the waveguide stub to ensure that the distance is less than λ. Any appropriate manner of manufacture can be used to create the waveguide stubs based on the desired implementation and feature sizes.

Figure 1A:
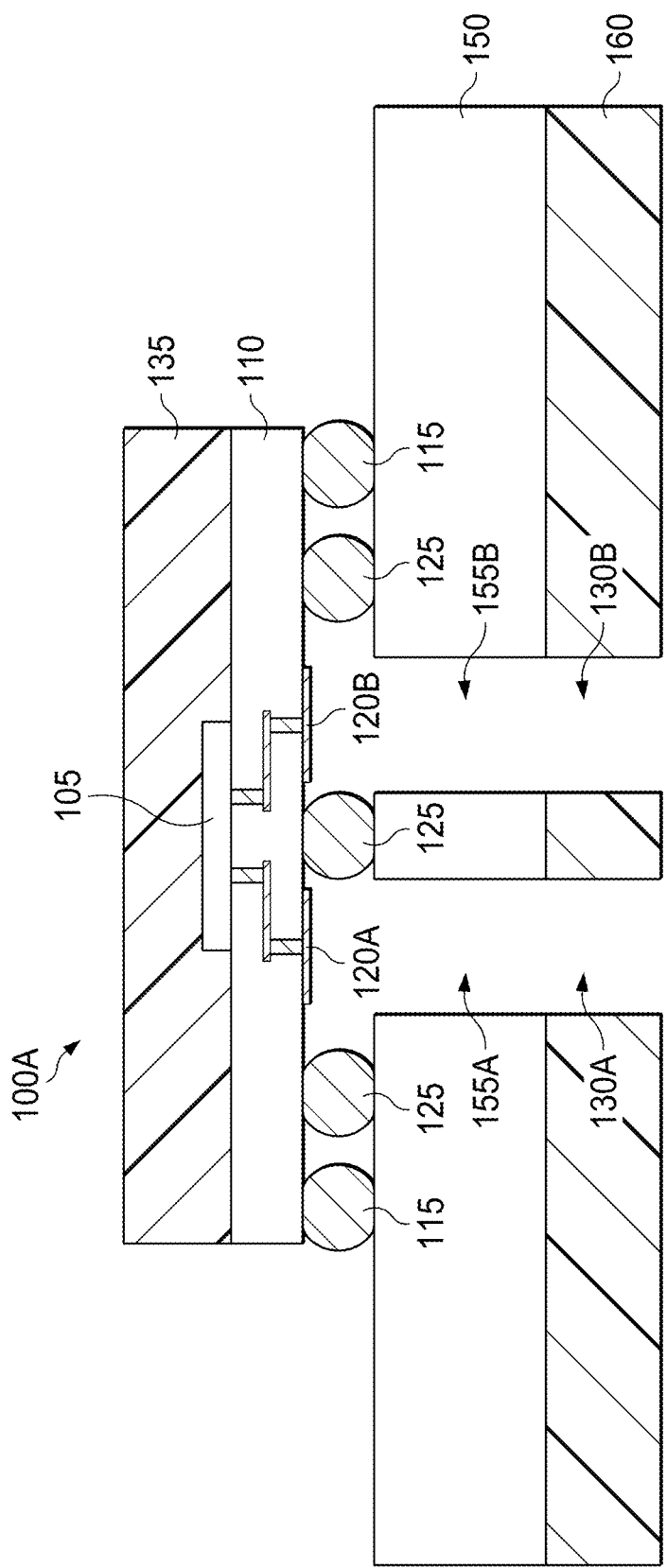
FIGS. 1A-B illustrate example bottom-side and top-side launch-on-package assemblies.

FIG. 1A illustrates an example bottom-side launch-on-package assembly 100A, which includes a semiconductor die 105 affixed to a package substrate 110 and encapsulated in a molding compound 135. The package substrate 110 is coupled to a waveguide interface side of a PCB substrate 150 by an array of solder balls 115 and 125. The waveguide 160 of a 3D antenna is coupled to the opposite, secondary waveguide side of PCB substrate 150 from the package substrate 110. Signal launches 120A-B are aligned with PCB through-holes 155A-B and waveguide openings 130A-B of the waveguide 160. The BGA includes open spaces over signal launches 120A-B, without solder balls.

The solder balls 125 around antenna launches 120A-B are grounded and act as a wave-guiding structure between the signal launches 120A-B and the PCB through-holes 155A-B. The wave-guiding structures comprising solder balls 125 isolate the signal channels for signal launches 120A-B and improve impedance matching between signal launches 120A-B and the waveguide 160. Solder balls 125 also decrease insertion loss between signal launches 120A-B and waveguide openings 130A-B of the waveguide 160. However, the reliance on BGA balls 125 and PCB through-holes 155A-B add manufacturing complexity, variability, and cost. Additional grounded BGA balls 125 may be required, increasing the overall package size and manufacturing cost. Further, a bottom-side launch-on-package assembly can be difficult to use at a system level.

Figure 1B:
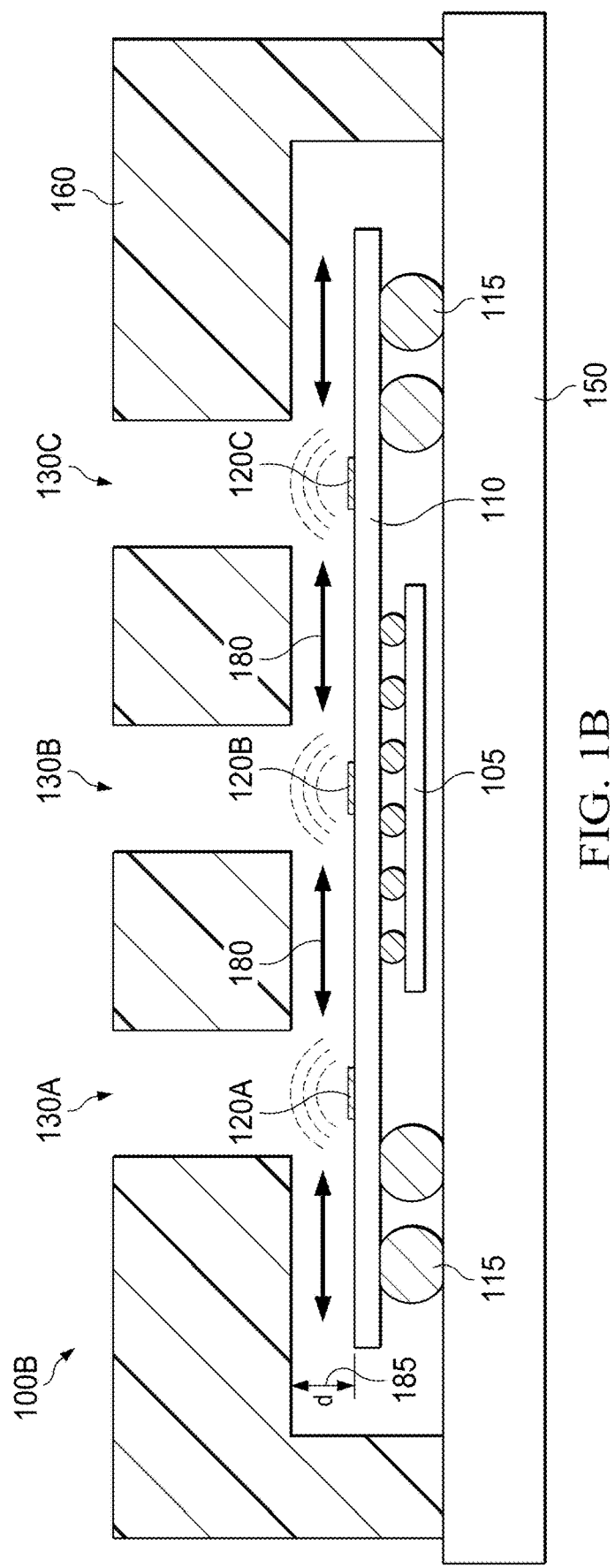

FIG. 1B illustrates an example top-side launch-on-package assembly 100B, which is similar to the bottom-side launch-on-package assembly 100A shown in FIG. 1A. Assembly 100B includes a semiconductor die 105 affixed to a package substrate 110, which is coupled to a PCB substrate 150 by an array of solder balls 115. The waveguide 160 of a 3D antenna is coupled to the PCB substrate 150 over and around the package substrate 110, separated from signal launches 120A-C and the package substrate 110 by a distance d 185. Signal launches 120A-C are aligned with waveguide openings 130A-C of a waveguide 160 of a 3D antenna.

Signal launch 120A emits signals to and/or receives signals from waveguide opening 130A. However, the gap 185 of distance d can create a field leakage path 180 between signal launch 120A and signal launch 120B, and so on, such that the assembly 100 has poor channel isolation and insertion loss due to high field leakage through the path 180. The width of gap 185 can vary due to manufacturing tolerances, increasing the unreliability of assembly 100B as well.

Figure 2:
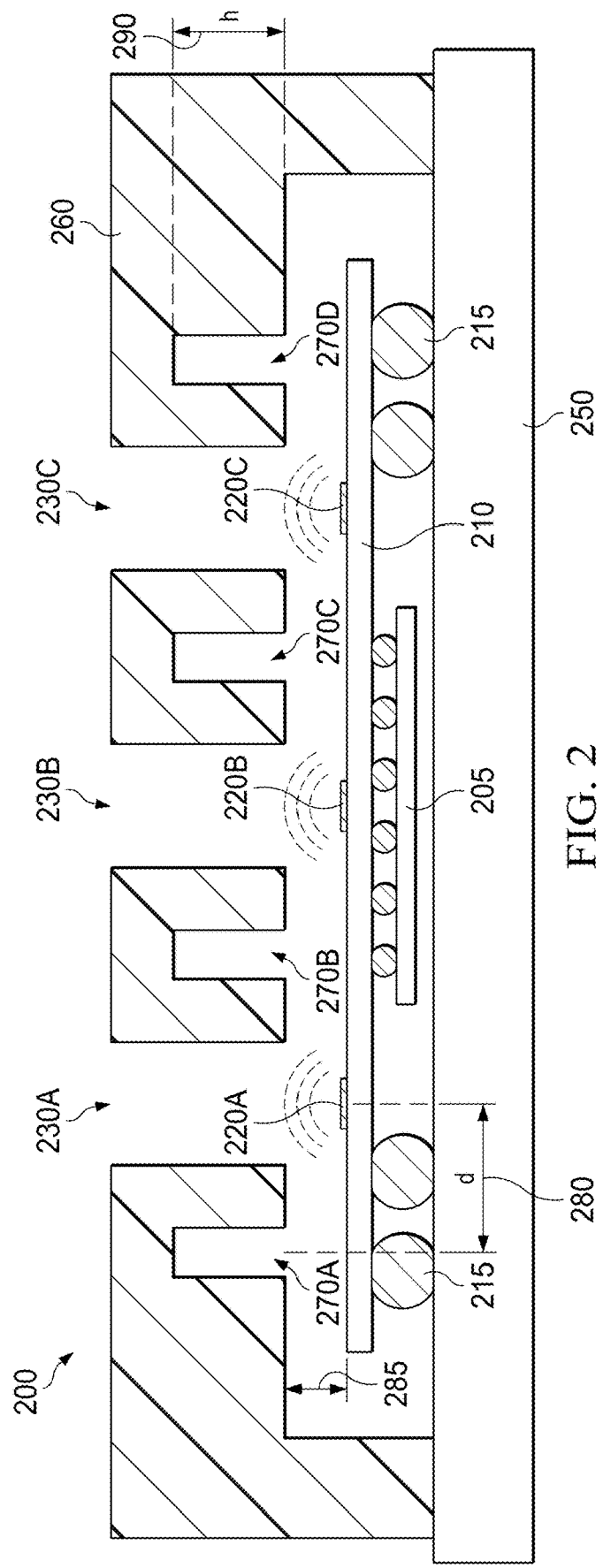
FIG. 2 illustrates an example top-side launch-on-package assembly with waveguide stubs in a waveguide of an associated 3D antenna.

FIG. 2 illustrates an example top-side launch-on-package assembly 200 with waveguide stubs 270 in a waveguide 260 of an associated 3D antenna. The assembly 200 is similar to assembly 100B shown in FIG. 1B, and also includes waveguide stubs 270A-D. Waveguide stubs 270A-B sandwich waveguide opening 230A; waveguide stubs 270B-C sandwich waveguide opening 230B; and waveguide stubs 270C-D sandwich waveguide opening 230C. The waveguide stubs 270A-D sandwich the waveguide openings 230A-C in the cross section view shown in FIG. 2, but in an overhead view, waveguide stubs 270A-D surround the waveguide openings 230A-C.

The distance d 280 from the center of the waveguide opening 230A to the center of the waveguide stub 270A is less than a wavelength λ of interest. The other waveguide stubs 270B-D are similarly distanced from the centers of waveguide openings 230B-C. The height h 290 of each waveguide stub 270A-D is approximately λ/4. The waveguide stubs 270A-D are placed on top of the gap 285, which acts as a parallel plate waveguide, and reflect signals due to high impedance discontinuities. The reflected signals constructively interfere with the field leakage signals between signal launches 220A-C in gap 285, improving insertion loss and reducing leakage between neighboring signal channels.

The distance d 280 and the height h 290 of the waveguide stubs 270A-D in waveguide 260 can be tailored to the frequency and wavelength λ of the signal of interest. In some implementations for millimeter wave signals, the height h 290 that is approximately λ/4 can be on the order of several hundreds of micrometers. The appropriate manner of manufacture for the waveguide 260 and waveguide stubs 270A-D can be chosen based on the particular implementation and the desired feature size for the wavelength of interest.

Figure 3A:
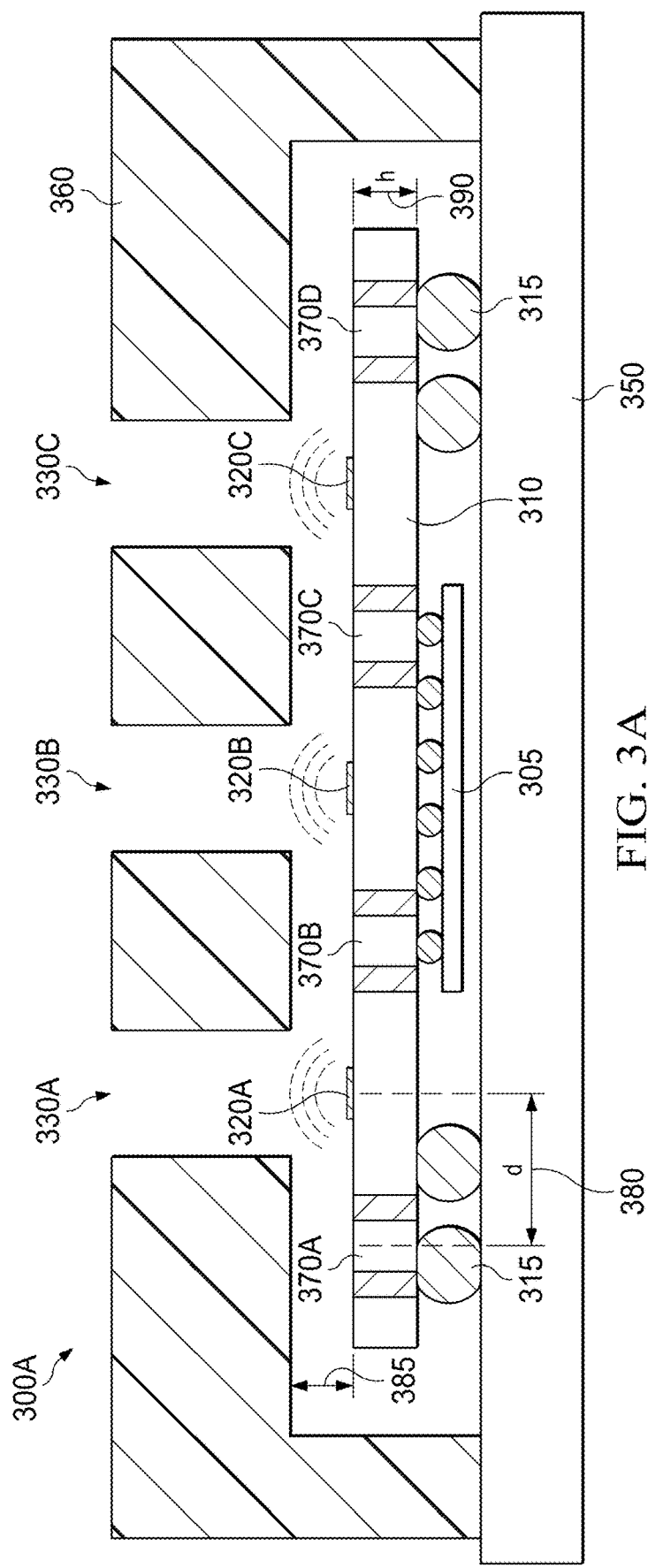
FIGS. 3A-C illustrate example top-side launch-on-package assemblies with waveguide stubs in a substrate of the package.
Figure 3B:
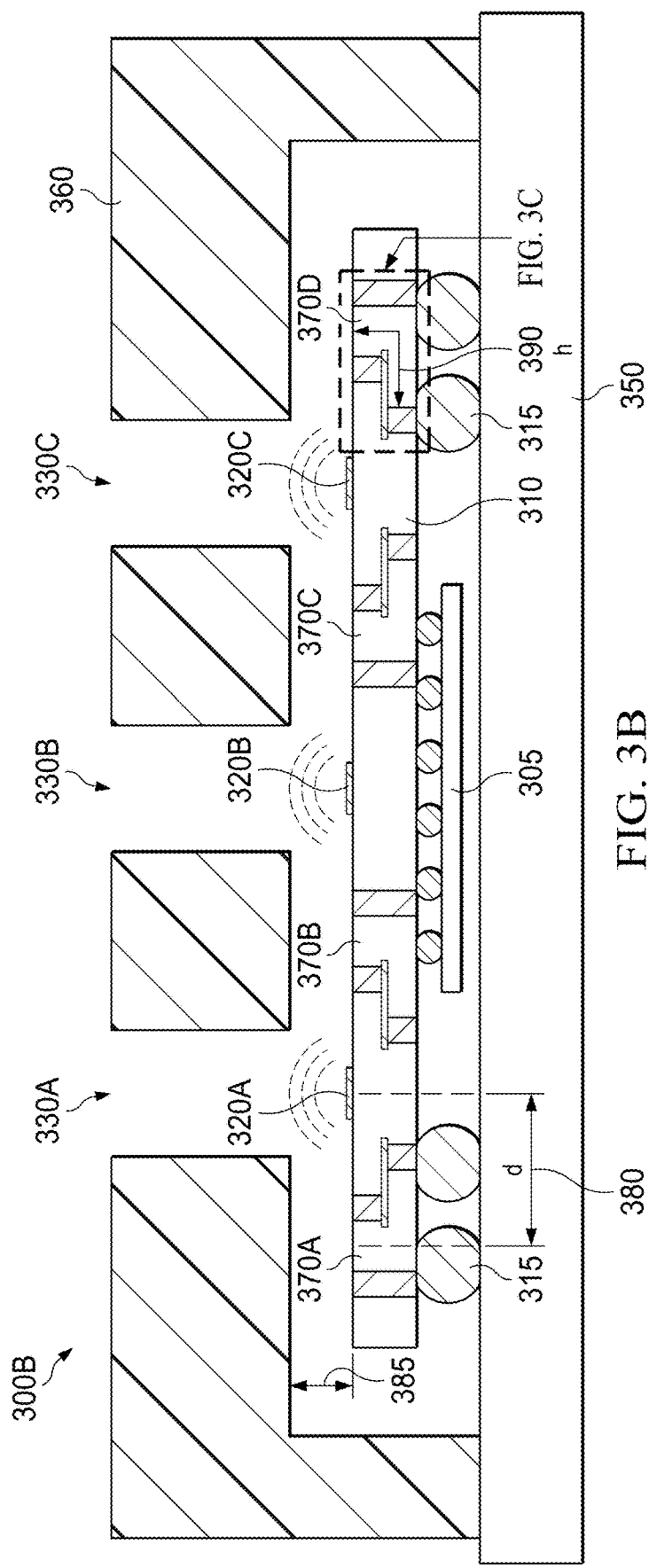
Figure 3C:
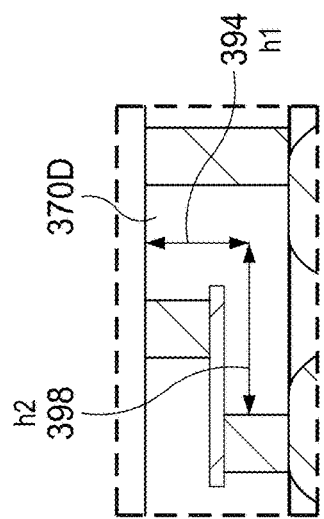

FIGS. 3A-C illustrate example top-side launch-on-package assemblies 300 with waveguide stubs 370 in a substrate of the package. The assembly 300 is similar to assembly 200 shown in FIG. 2, but waveguide stubs 370 are placed in the substrate 310 rather than in the waveguide 360. In FIG. 3A, the waveguide stubs 370 are placed vertically in substrate 310. Placing waveguide stubs 370 in the substrate 310 rather than the waveguide 360 allows the 3D antenna including waveguide 360 to be chosen or changed without regard to the necessity of waveguide stubs 370. Similar to waveguide stubs 270A-D, the distance d 380 from the center of the respective waveguide opening 330 to the center of the respective waveguide stub 370 is less than a wavelength λ of interest, and the height h 390 of each waveguide stub 370 is approximately λ/4.

Including the waveguide stubs 370 in the substrate 310 causes substrate 310 to be at least as thick as the height h 390, which can be thicker than if substrate 310 did not include the waveguide stubs 370. In FIG. 3B, the waveguide stubs 370 are L-shaped and included in the substrate 310. Each L-shaped waveguide stub 370 in assembly 300B has a total depth h 390 that is approximately λ/4, divided between the two arms of the L shape. FIG. 3C shows waveguide stub 370D in more detail, the total depth h 390 is divided into h1 394 of the vertical arm and h2 398 of the horizontal arm. The length h1 394 and the length h2 398 add up to the total depth h 390. The necessary thickness of the substrate 310 is decreased from the height 390 in assembly 300A in FIG. 3A to the partial length h1 394. The appropriate manner of manufacture for the substrate 310 and waveguide stubs 370A-D can be chosen based on the particular implementation and the desired feature size for the wavelength of interest.

FIG. 4 illustrates an example bottom-side launch-on-package assembly 400 with waveguide stubs 470 in a printed circuit board 450 to which the assembly is affixed. The assembly 400 is similar to assembly 100A shown in FIG. 1A, and also includes waveguide stubs 470A-D. Waveguide stubs 470A-B sandwich waveguide opening 430A; waveguide stubs 470B-C sandwich waveguide opening 430B; and waveguide stubs 470C-D sandwich waveguide opening 430C. The waveguide stubs 470A-D sandwich the waveguide openings 430A-C in the cross section view shown in FIG. 4, but in an overhead view, waveguide stubs 470A-D surround the waveguide openings 430A-C.

Similar to waveguide stubs 270A-D and 370A-D, the distance d 480 from the center of the respective waveguide opening 430 to the center of the respective waveguide stub 470 is less than a wavelength λ of interest, and the height h 490 of each waveguide stub 470 is approximately λ/4. Including the waveguide stubs 470 in the PCB 450 reduces the necessary thickness of the substrate 410 and allows the waveguide stubs to be used in bottom-side assemblies as well as top-side assemblies. The appropriate manner of manufacture for the PCB 450 and waveguide stubs 470A-D can be chosen based on the particular implementation and the desired feature size for the wavelength of interest.

Figure 5:
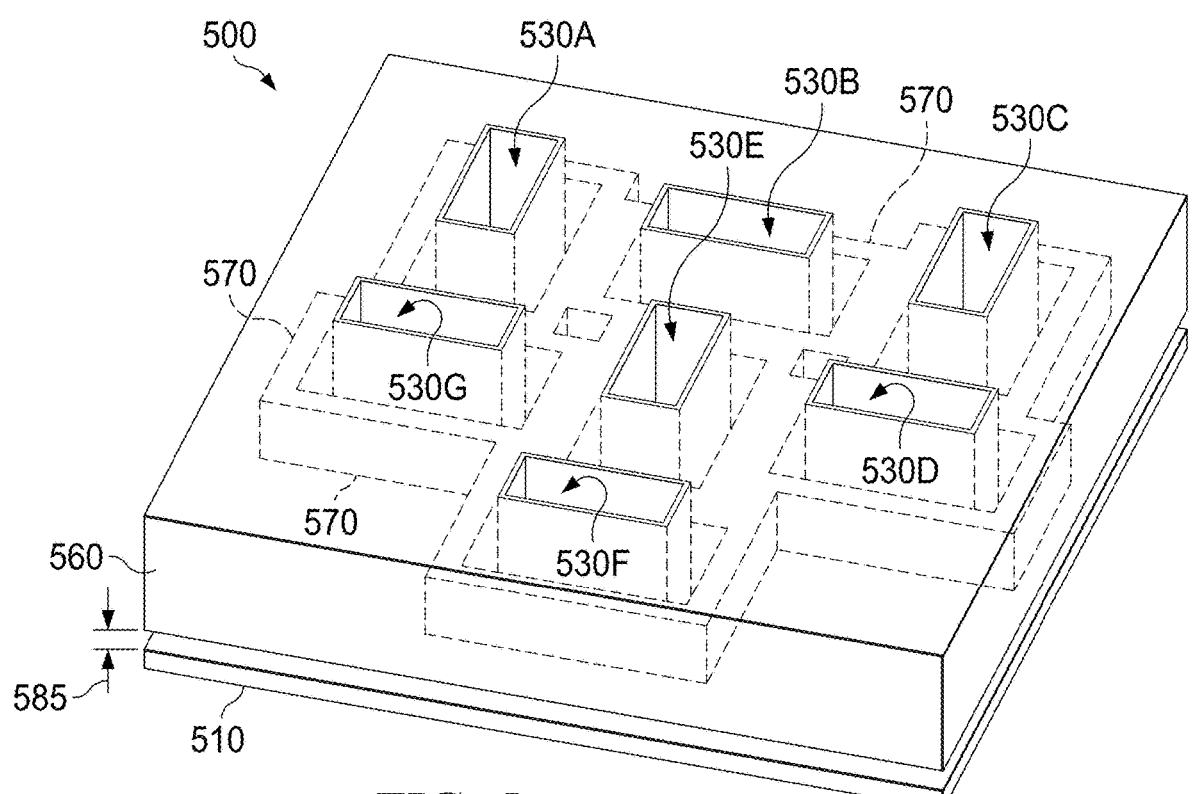
FIG. 5 illustrates an angled view of an example top-side launch-on-package assembly with waveguide stubs in a waveguide of an associated 3D antenna.

FIG. 5 illustrates an angled, see-through perspective of an example top-side launch-on-package assembly 500 with waveguide stub structure 570 in a waveguide 560 of an associated 3D antenna, similar to waveguide stubs 270 in waveguide 260 shown in FIG. 2. The angled view of assembly 500 shows the 3D antenna-facing side of the waveguide 560 and a see-through perspective illustrating that waveguide stub structure 570 surrounds the waveguide openings 530A-G. Any number or shape of signal launches on substrate 510 and corresponding waveguide openings 530A-G can be surrounded by the waveguide stub structure 570. The waveguide stub structure 570 surrounding each waveguide opening 530 can join together into single cutout section, such that the signal launches and waveguide openings 530 can be placed close together and further compact the channel placement in assembly 500.

As shown in the cross-section of the waveguide 260 shown in FIG. 2, the depth of the waveguide stub structure 570 is not required to fully extend from the IC-facing side of the waveguide 560 to the 3D antenna-facing side. The gap 585 acts as a parallel-plate waveguide between the signal launches and causes signal leakage between the channels. To counteract the signal leakage through gap 585, the waveguide stub structure 570 surrounding each waveguide opening 530 reflect the signal leakage, and the reflected signals constructively interfere with the signal leakage to improve channel isolation. Constructive interference between the reflected signal from the waveguide stub structure 570 and the signal leakage through gap 585 greatly reduces the amount of signal leakage that reaches the neighboring channels.

FIGS. 6A-C illustrate graphs of channel isolation, insertion loss, and return loss for the example top-side launch-on-package assembly 500 shown in FIG. 5. The graphs of channel isolation, insertion loss, and return loss are included for demonstration purposes only, and do not necessarily represent an optimized assembly. Further, the graphs of channel isolation, insertion loss, and return loss correspond to a particular implementation for particular parameters; other implementations with other parameters experience different channel isolation, insertion loss, and return loss.

FIG. 6A shows a graph of channel isolation 600A for the assembly 500 with waveguide stubs 570 and channel isolation 650A for a similar assembly without waveguide stubs. The channel isolation 600A is approximately twenty decibels (dB) better than the channel isolation 650A at the frequencies of interest, marked by frequency A, frequency B, and frequency C. FIG. 6B shows a graph of insertion loss 600B for the assembly 500 with waveguide stubs 570 and insertion loss 650B for a similar assembly without waveguide stubs. The insertion loss 600B is approximately two dB better than the insertion loss 650B at the frequencies of interest.

FIG. 6C shows a graph of return loss comparing the return loss 600C at the signal launch 520 to the return loss 610 at the waveguide opening 530 with a waveguide stub 570 and the return loss 650C at the signal launch to the return loss 660 at the waveguide opening without a waveguide stub. The waveguide stub 570 improves return loss of assembly 500 to greater than sixteen dB compared to a return loss of approximately eleven dB for the similar assembly without waveguide stubs. Inclusion of waveguide stubs in a launch-on-package assembly improves insertion loss and return loss as well as channel isolation.

FIGS. 7A-D illustrate overhead and cross section views of an example top-side launch-on-package assembly 700 with circular waveguide stubs 770 in a waveguide of an associated 3D antenna, as well as a simulation plot of a signal through the assembly 700 and a graph of channel isolation for the assembly 700. The circular waveguide openings 730 and the circular waveguide stubs 770 in assembly 700 illustrate that any shape of signal launch, waveguide opening, and waveguide stub can be implemented, as long as the centers of the waveguide stubs 770 are a distance d 780 from the center of the waveguide openings 730. The distance d 780 is less than a wavelength λ of interest.

Figure 7A:
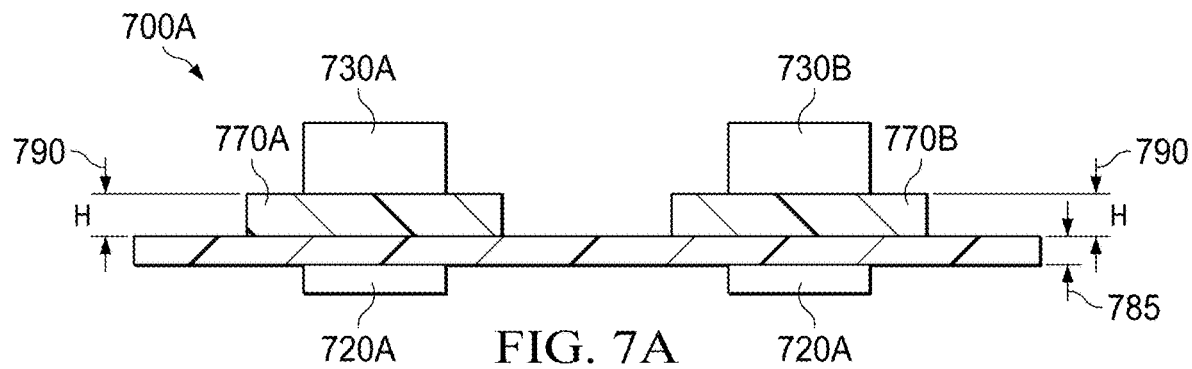
Figure 7B:
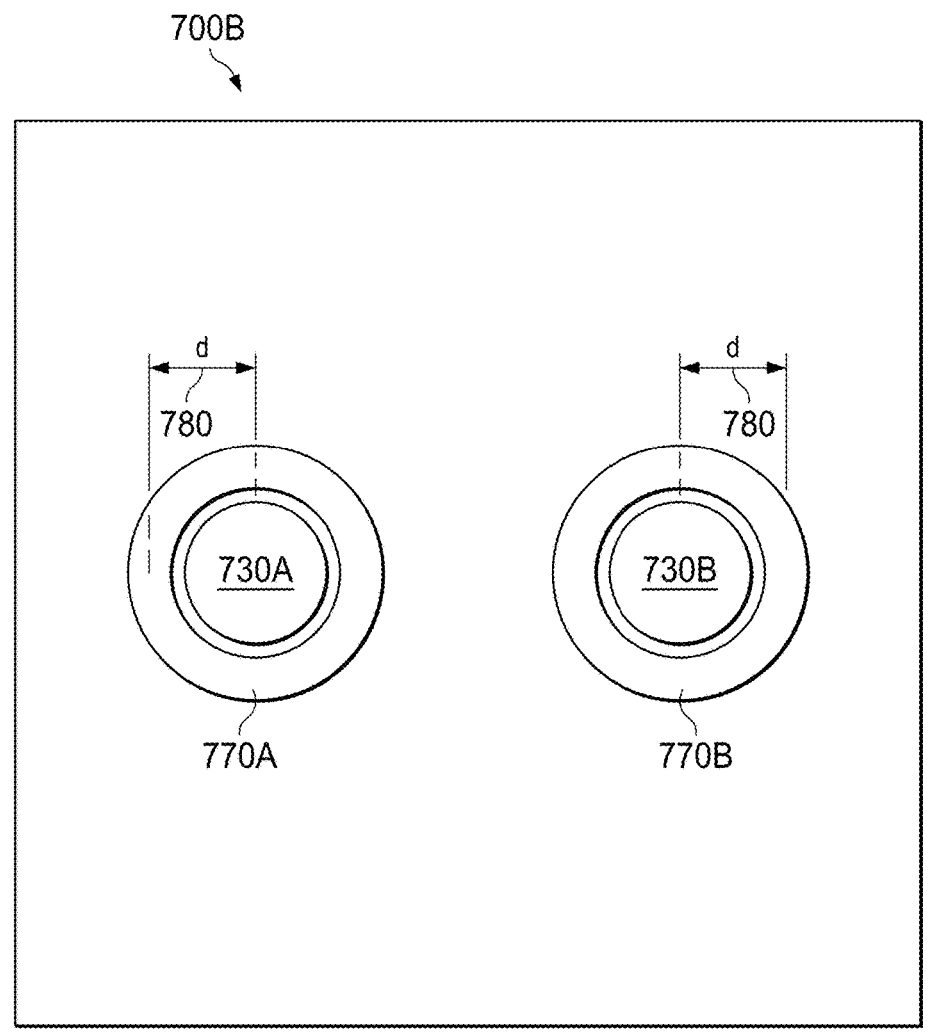

FIG. 7A shows a cross section view 700A of the assembly 700. Signal launches 720A-B are aligned with waveguide openings 730A-B, respectively, and separated from the waveguide openings 730A-B by the gap 785, which acts as a parallel plate waveguide. Waveguide stubs 770A-B have a height h 790 that is approximately λ/4. FIG. 7B shows an overhead view 700B of the assembly 700. Waveguide openings 730A-B are each encircled by a waveguide stub 770A and 770B, respectively. The centers of the waveguide stubs 770A-B are a distance d 780 from the center of the waveguide openings 730A-B.

Figure 7C:
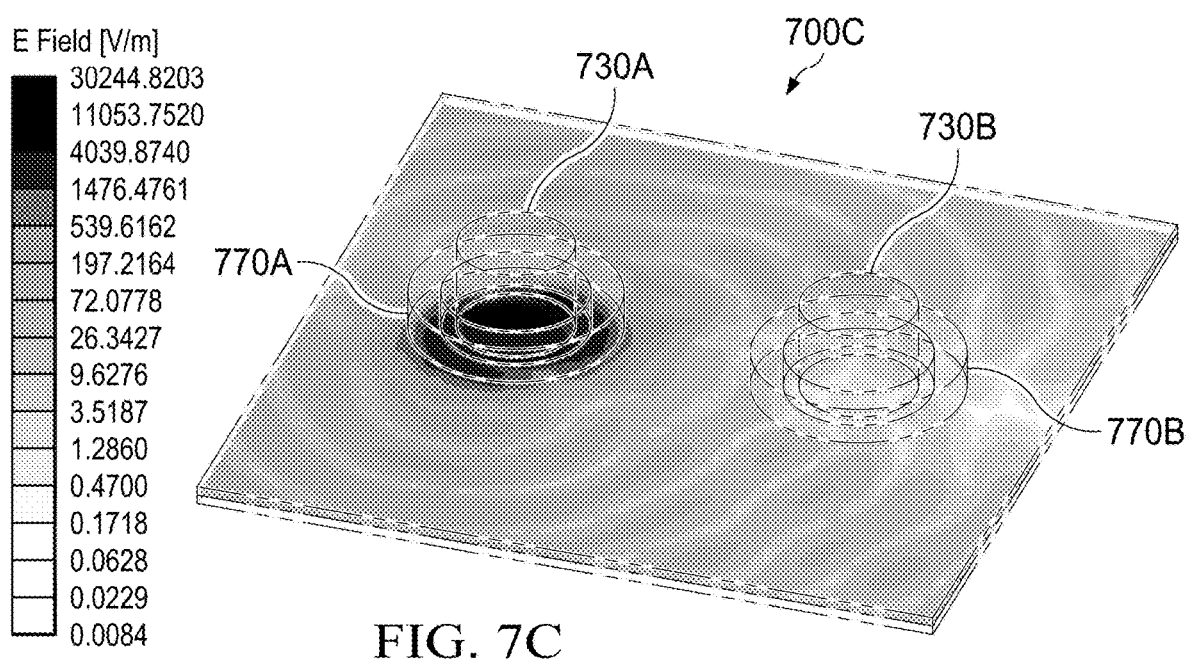

FIG. 7C shows a simulation plot 700C of a signal through the gap 785, waveguide openings 730A-B, and waveguide stubs 770A-B. The signal is transmitted from launch 720A through waveguide opening 730A. The reflected signal from waveguide stub 770A blocks the signal leakage from signal launch 720A, such that signal launch 720B and waveguide opening 730B experience greatly reduced signal leakage and improved channel isolation. FIG. 7D shows a graph of channel isolations 792, 794, 796, and 798 for four channels with circular waveguide openings 730 and circular waveguide stubs 770. The channel isolations 792, 794, 796, and 798 are greater than 120 dB.

Figure 8A:
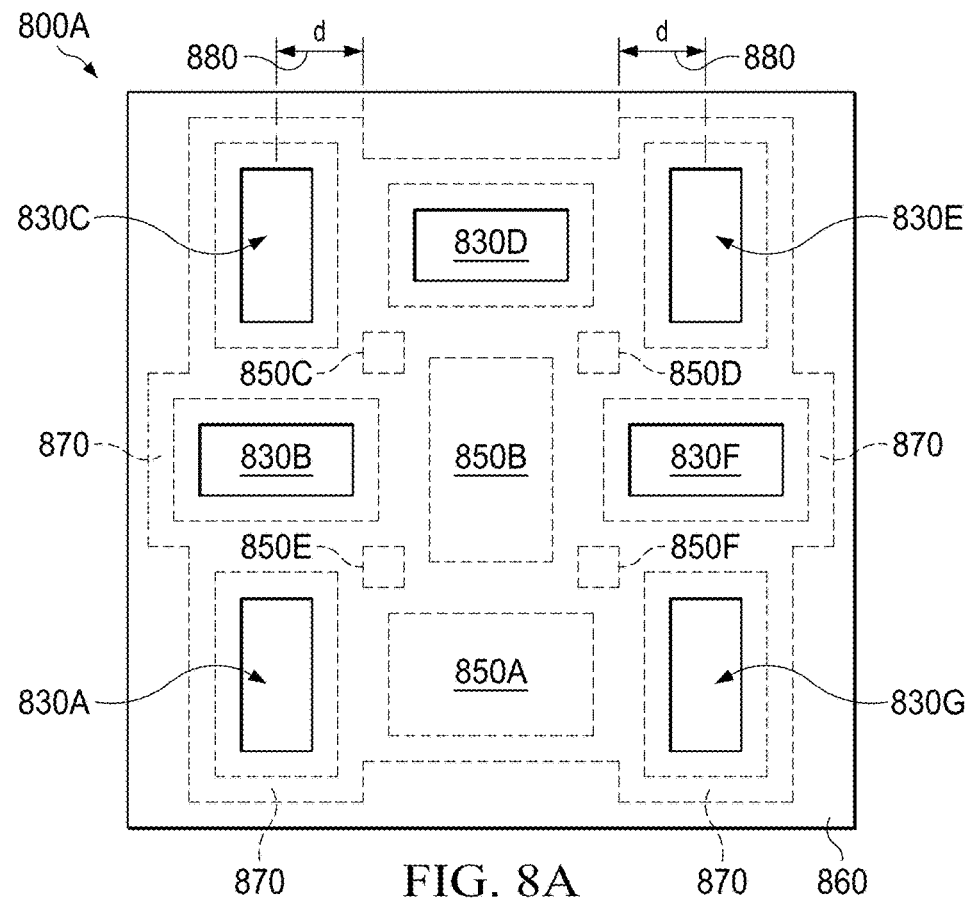
FIGS. 8A-C illustrate an angled view and an overhead view of a waveguide with waveguide stubs, as well as a simulation plot of a signal through the waveguide.
Figure 8B:
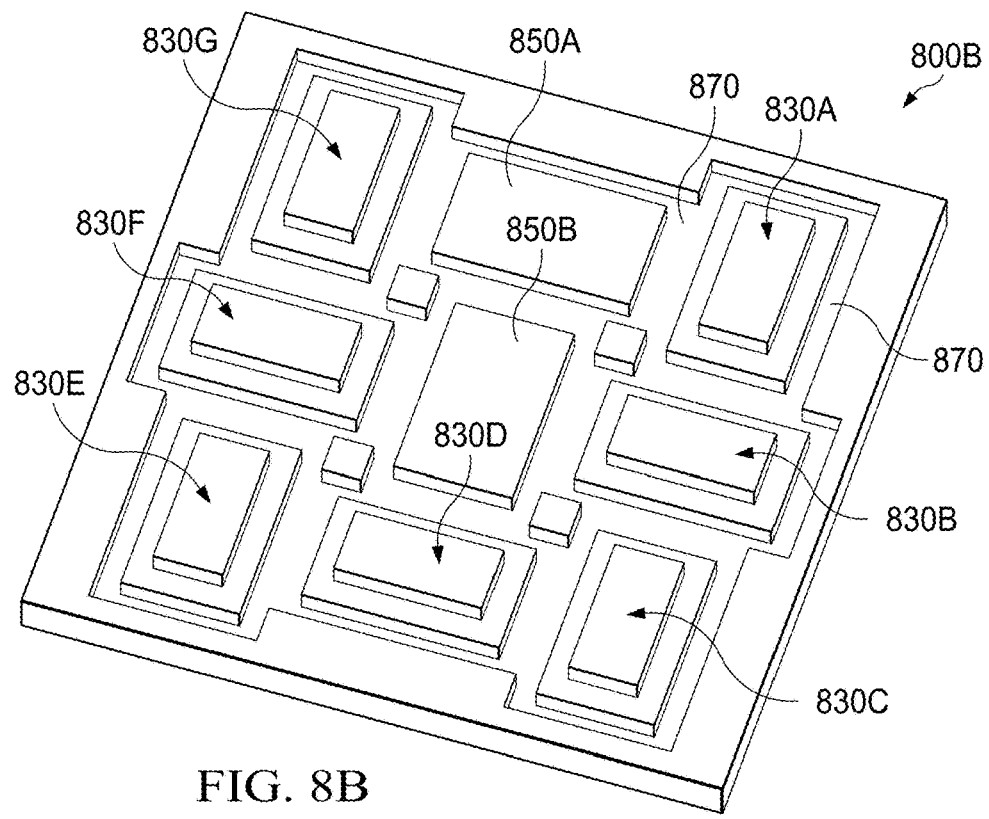
Figure 8C:
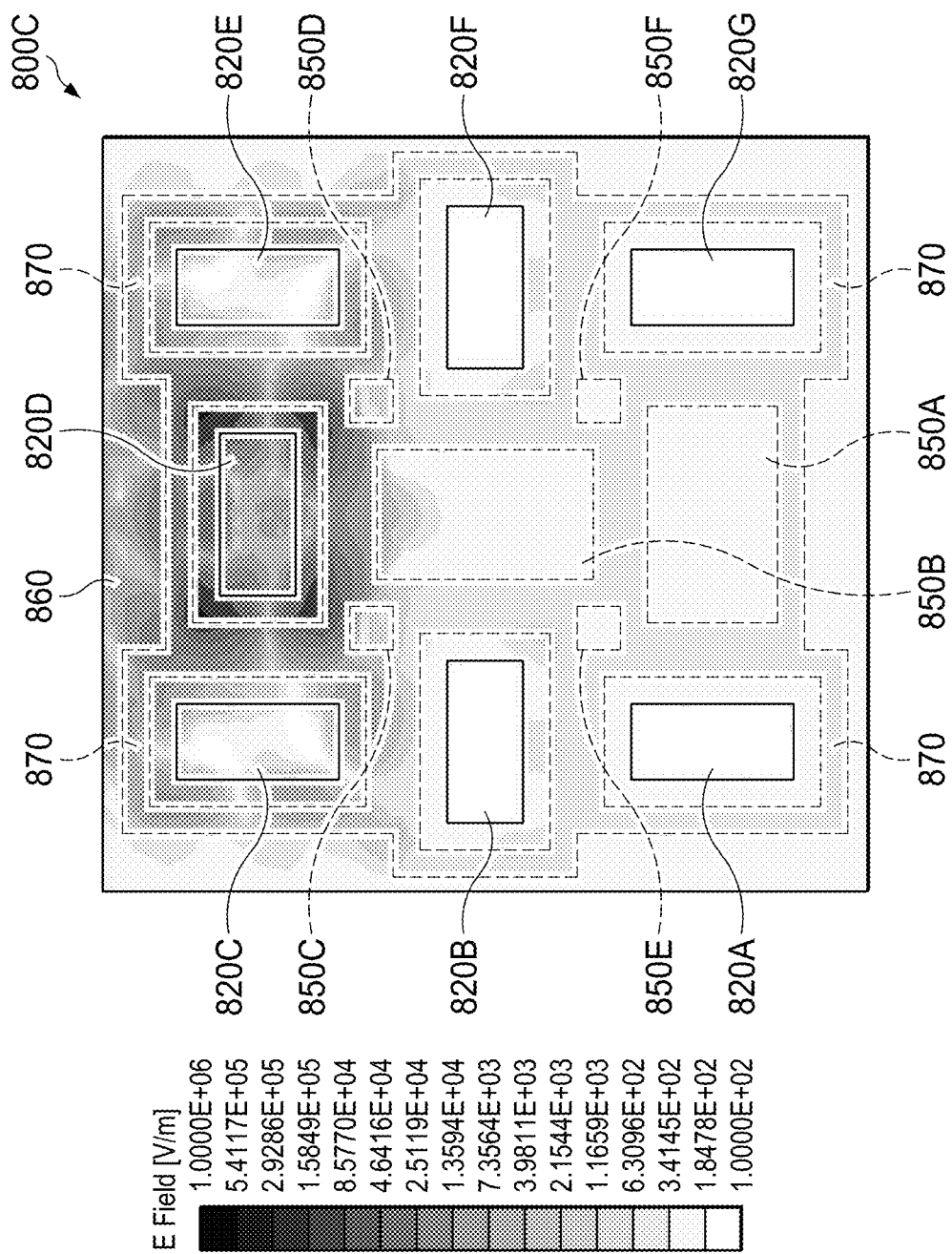

FIGS. 8A-C illustrate overhead and angled views of a waveguide 800 with a waveguide stub structure 870, as well as a simulation plot 800C of a signal through the waveguide. Similar to the circular waveguide openings 730 and waveguide stubs 770 shown in FIGS. 7A-B, the rectangular waveguide openings 830 illustrate that any shape of signal launch, waveguide opening, and waveguide stub can be implemented.

FIG. 8A shows an overhead view 800A of the IC-facing side of the waveguide 800. The waveguide openings 830A-G expose the place through which a corresponding signal launch 820A-G would transmit or receive a signal. Each waveguide opening 830 is encircled with the cutout of waveguide stub structure 870. The compact channel placement of waveguide openings 830A-G causes the individual waveguide stubs around each of the waveguide openings to join together to form waveguide stub structure 870. Dead-space sections 850 are strategically-placed bumps or space-fillers between the waveguide openings 830A-G to occupy space in the waveguide stub 870, such that a center of cutout waveguide stub structure 870 is not greater than a wavelength $\lambda$ of interest from the center of the nearby waveguide openings 830.

Dead-space section 850A occupies spaces between waveguide opening 830A and 830G, such that the distance d 880 between the center of waveguide opening 830A and the center of the section of the waveguide stub structure 870 between waveguide opening 830A and dead-space section 850A is less than $\lambda$. The remaining dead-space sections 850B-F are similarly placed to break up the cutout waveguide stub structure 870 and keep the distance d 880 between the center of the waveguide opening 830 and the center of the neighboring section of the waveguide stub structure 870 less than A. FIG. 8B shows an angled view 800B of the IC-facing side of waveguide 800, and illustrates that the height h 890 of waveguide stub structure 870 is approximately $\lambda/4$. The dead-space sections 850 break up the space between the cutout waveguide stub structure 870.

FIG. 8C shows a simulation plot 800C of a signal through a gap 885 between waveguide 800 and signal launches 820, waveguide openings 830A-G, and waveguide stub structure 870. The signal is transmitted from signal launch 820D through waveguide opening 830D. The reflected signal from the sections of waveguide stub structure 870 around waveguide opening 830D constructively interferes with the signal leakage from signal launch 820D through the gap 895 between signal launch 820D and waveguide 800. The leakage experienced at the neighboring waveguide openings 830C and 830E is greatly reduced, such that the corresponding signal launches 820C and 820E are isolated from signal launch 820D.

The term "couple" is used throughout the specification. The term may cover connections, communications, or signal paths that enable a functional relationship consistent with the description of this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A device, comprising:
    a printed circuit board (PCB);
    a substrate affixed to the PCB and comprising a signal launch on a surface of the substrate, the signal launch configured to emit or receive a signal;
    an integrated circuit (IC) die affixed to the substrate;
    an antenna comprising a waveguide opening and affixed to the PCB, wherein the signal launch and the waveguide opening are aligned and comprise a signal channel; and
    a waveguide stub arranged as a boundary around the signal channel, in which a center of the waveguide stub is a distance less than $\lambda$ from a center of the signal channel, and $\lambda$ represents a wavelength of the signal.

2. The device of claim 1, wherein the waveguide stub has a height of $\lambda/4$.

3. The device of claim 1, wherein the antenna further comprises the waveguide stub arranged as a boundary around the waveguide opening.

4. The device of claim 1, wherein the substrate further comprises the waveguide stub arranged as a boundary around the signal launch.

5. A device comprising:
    a printed circuit board (PCB);
    a substrate affixed to the PCB and comprising a signal launch on a surface of the substrate, the signal launch configured to emit or receive a signal;
    an integrated circuit (IC) die affixed to the substrate;
    an antenna comprising a waveguide opening and affixed to the PCB, wherein the signal launch and the waveguide opening are aligned and comprise a signal channel; and
    a waveguide stub arranged as a boundary around the signal channel, in which the substrate comprises the waveguide stub arranged as a boundary around the signal launch, the waveguide stub is straight in the substrate in a direction normal to the surface of the substrate, and a thickness of the substrate is at least as thick as a height of the waveguide stub.

6. A device comprising:
    a printed circuit board (PCB);
    a substrate affixed to the PCB and comprising a signal launch on a surface of the substrate, the signal launch configured to emit or receive a signal;
    an integrated circuit (IC) die affixed to the substrate;
    an antenna comprising a waveguide opening and affixed to the PCB, wherein the signal launch and the waveguide opening are aligned and comprise a signal channel; and
    a waveguide stub arranged as a boundary around the signal channel, in which:
        the substrate comprises the waveguide stub arranged as a boundary around the signal launch;
        the waveguide stub is L-shaped and comprises: a first arm that is straight in the substrate in a direction normal to the surface of the substrate and having a first height; and a second arm arranged perpendicular to the first arm and having a second height;
        a sum of the first and second heights is $\lambda/4$;
        $\lambda$ represents a wavelength of the signal; and
        a thickness of the substrate is at least as thick as the first height.

7. A device comprising:
    a printed circuit board (PCB);
    a substrate affixed to the PCB and comprising a signal launch on a surface of the substrate, the signal launch configured to emit or receive a signal;
    an integrated circuit (IC) die affixed to the substrate;
    an antenna comprising a waveguide opening and affixed to the PCB, wherein the signal launch and the waveguide opening are aligned and comprise a signal channel; and a waveguide stub arranged as a boundary around the signal channel, in which:
  the PCB comprises the waveguide stub and a through-hole cavity from a first surface of the PCB to a second surface of the PCB opposite the first surface;
  the waveguide stub is arranged as a boundary around the through-hole cavity;
  the surface of the substrate is affixed to the first surface of the PCB;
  the antenna is affixed to the second surface of the PCB; and
  the signal launch, the through-hole cavity, and the waveguide opening are aligned.

8. A device, comprising:
a printed circuit board (PCB);
a substrate affixed to the PCB and comprising a first signal launch on a surface of the substrate, the first signal launch configured to emit or receive a first signal;
an integrated circuit (IC) die affixed to the substrate;
an antenna comprising a first waveguide opening and affixed to the PCB, wherein the first signal launch and the first waveguide opening are aligned and comprise a first signal channel; and
a first waveguide stub arranged as a boundary around the first signal channel;
a second signal launch on the surface of the substrate, the second signal launch configured to emit or receive a second signal;
a second waveguide opening in the antenna, wherein the second signal launch and the second waveguide opening are aligned and comprise a second signal channel; and
a second waveguide stub arranged as a boundary around the second signal channel.

9. The device of claim 8, wherein the first and second signal channels are arranged such that the first waveguide stub and the second waveguide stub comprise a waveguide stub structure, a center of the waveguide stub structure is a distance less than $\lambda$ from a center of the first signal channel and the distance less than $\lambda$ from a center of the second signal channel, and $\lambda$ represents a wavelength of the first and second signals.

10. The device of claim 8, wherein the first waveguide stub and the second waveguide stub comprise a waveguide stub structure, the device further comprising a dead-space section arranged between the first and second signal channels in the waveguide stub structure such that:
  a center of the first signal channel is a distance less than $\lambda$ from a center of a first section of the waveguide stub structure between the first signal channel and the dead-space section; and
  a center of the second signal channel is the distance less than $\lambda$ from a center of a second section of the waveguide stub structure between the second signal channel and the dead-space section, wherein $\lambda$ represents a wavelength of the first and second signals.

11. A printed circuit board (PCB), comprising:
a PCB substrate;
a package substrate affixed to the PCB substrate and comprising a signal launch on a surface of the package substrate, the signal launch configured to emit or receive a signal;
an integrated circuit (IC) die affixed to the package substrate;
a waveguide to an antenna, wherein the waveguide is affixed to the PCB substrate over the package substrate and comprises a waveguide opening, the waveguide is separated from the surface of the package substrate by a gap, and the waveguide opening and the signal launch are aligned;
a signal channel between the signal launch and the antenna, wherein the signal channel comprises the gap and the waveguide opening; and
a waveguide stub arranged as a boundary around the signal channel, in which the signal has a wavelength $\lambda$, a center of the waveguide stub is a distance less than $\lambda$ from a center of the signal channel, and the waveguide stub has a height of $\lambda/4$.

12. The PCB of claim 11, wherein the waveguide further comprises the waveguide stub arranged as a boundary around the waveguide opening.

13. The PCB of claim 11, wherein the package substrate further comprises the waveguide stub arranged as a boundary around the signal launch.

14. A printed circuit board (PCB), comprising:
a PCB substrate;
a package substrate affixed to the PCB substrate and comprising a signal launch on a surface of the package substrate, the signal launch configured to emit or receive a signal;
an integrated circuit (IC) die affixed to the package substrate;
a waveguide to an antenna, wherein the waveguide is affixed to the PCB substrate over the package substrate and comprises a waveguide opening, the waveguide is separated from the surface of the package substrate by a gap, and the waveguide opening and the signal launch are aligned;
a signal channel between the signal launch and the antenna, wherein the signal channel comprises the gap and the waveguide opening; and
a waveguide stub arranged as a boundary around the signal channel, in which the package substrate comprises the waveguide stub arranged as a boundary around the signal launch, the waveguide stub is straight in the package substrate in a direction normal to the surface of the package substrate, and a thickness of the package substrate is at least as thick as $\lambda/4$.

15. A printed circuit board (PCB), comprising:
a PCB substrate;
a package substrate affixed to the PCB substrate and comprising a signal launch on a surface of the package substrate, the signal launch configured to emit or receive a signal;
an integrated circuit (IC) die affixed to the package substrate;
a waveguide to an antenna, wherein the waveguide is affixed to the PCB substrate over the package substrate and comprises a waveguide opening, the waveguide is separated from the surface of the package substrate by a gap, and the waveguide opening and the signal launch are aligned;
a signal channel between the signal launch and the antenna, wherein the signal channel comprises the gap and the waveguide opening; and
a waveguide stub arranged as a boundary around the signal channel, in which:
  the package substrate comprises the waveguide stub arranged as a boundary around the signal launch;
  the waveguide stub is L-shaped and comprises: a first arm straight in the package substrate in a direction normal to the surface of the package substrate and having a first height and a second arm arranged perpendicular to the first arm and having a second height, a sum of the first and second heights being $\lambda/4$; and a thickness of the package substrate is at least as thick as the first height.

16. An integrated circuit (IC) chip, comprising:
a printed circuit board (PCB);
a substrate affixed to the PCB and having a surface, the substrate comprising:
    a first signal launch on the surface configured to emit or receive a first signal, and
    a second signal launch on the surface configured to emit or receive a second signal;
an IC die affixed to the substrate;
a waveguide to an antenna, wherein:
    the waveguide comprises a first opening and a second opening,
    the waveguide is affixed to the PCB such that the first and second openings are aligned with the first and second signal launches, respectively,
    the first signal launch and the first opening comprise a first signal channel,
    the second signal launch and the second opening comprise a second signal channel;
a first waveguide stub arranged as a boundary around the first signal channel; and
a second waveguide stub arranged as a boundary around the second signal channel.

17. The IC chip of claim 16, wherein the waveguide further comprises the first waveguide stub arranged as a boundary around the first opening and the second waveguide stub arranged as a boundary around the second opening.

18. The IC chip of claim 16, wherein the substrate further comprises the first waveguide stub arranged as a boundary around the first signal launch and the second waveguide stub arranged as a boundary around the second signal launch.

19. The IC chip of claim 18, wherein:
the first signal has a wavelength ($\lambda 1$);
the second signal has a wavelength ($\lambda 2$);
the first waveguide stub has a height of ($\lambda 1$)/4 and is arranged such that a center of the first waveguide stub is a distance less than ($\lambda 1$) from a center of the first signal channel; and
the second waveguide stub has a height of ($\lambda 2$)/4 and is arranged such that a center of the second waveguide stub is a distance less than ($\lambda 2$) from a center of the second signal channel.

20. The IC chip of claim 19, wherein the first and second waveguide stubs are straight in the substrate in a direction normal to the surface of the substrate, and a thickness of the substrate is at least as thick as the greater of ($\lambda 1$)/4 or ($\lambda 2$)/4.

21. The IC chip of claim 19, wherein:
the first waveguide stub is L-shaped and comprises a first arm straight in the substrate in a direction normal to the surface of the substrate and having a first height and a second arm arranged perpendicular to the first arm and having a second height, a sum of the first and second heights being ($\lambda 1$)/4;
the second waveguide stub is L-shaped and comprises a third arm straight in the substrate in a direction normal to the surface of the substrate and having a third height and a fourth arm arranged perpendicular to the third arm and having a fourth height, a sum of the third and fourth heights being ($\lambda 2$)/4; and
a thickness of the substrate is at least as thick as the greater of the first or third height.

\* \* \* \* \*